United States Patent [19]

Kimoto et al.

[11] Patent Number: 4,935,333

[45] Date of Patent: Jun. 19, 1990

[54] WATER-DEVELOPABLE PHOTOSENSITIVE RESIN COMPOSITION AND RESIN OR PRINTING PLATE THEREFROM

[75] Inventors: Koichi Kimoto, Hirakata; Yasushi Umeda, Kusatsu; Chitoshi Kawaguchi, Soraku; Toshitaka Kawanami, Nishinomiya, all of Japan

[73] Assignee: Nippon Paint Co., Ltd., Osaka, Japan

[21] Appl. No.: 144,808

[22] Filed: Jan. 15, 1988

[30] Foreign Application Priority Data

Jan. 17, 1987 [JP] Japan ................................ 62-8814
Jan. 17, 1987 [JP] Japan ................................ 62-8815

[51] Int. Cl.$^5$ .......................... G03C 1/68; G03C 5/16
[52] U.S. Cl. ........................ 430/285; 430/909; 430/288; 430/306; 430/281; 430/325; 522/142; 522/144; 522/121; 522/123
[58] Field of Search ............... 430/909, 288, 306, 281, 430/325, 285; 522/142, 144, 121, 123

[56] References Cited

U.S. PATENT DOCUMENTS

| | | | |
|---|---|---|---|
| 2,902,365 | 9/1959 | Martin | 430/306 X |
| 3,261,686 | 7/1966 | Celeste | 522/121 X |
| 4,565,854 | 1/1986 | Sato et al. | 526/214 |
| 4,621,044 | 11/1986 | Fujikawa | 430/288 X |
| 4,654,294 | 3/1987 | Sato et al. | 430/281 |

FOREIGN PATENT DOCUMENTS

| | | | |
|---|---|---|---|
| 610545 | 12/1960 | Canada | 430/306 |
| 0084851 | 8/1983 | European Pat. Off. | |
| 0185337 | 6/1986 | European Pat. Off. | |
| 0196571 | 10/1986 | European Pat. Off. | |

Primary Examiner—Paul R. Michl
Assistant Examiner—Cynthia Hamilton
Attorney, Agent, or Firm—Gregory O. Garmong

[57] ABSTRACT

Disclosed is a water-developable photosensitive resin composition capable of hot melt molding, which comprises:

(i) a water soluble or water dispersible polyvinyl alcohol prepared by saponifying a copolymer which is obtained from copolymerizing 0 to 20 mol % of a monomer not having an ionic group (hereinafter referred to as "nonionic monomer"), 0 to 10 mol % of an ionic group-containing monomer (hereinafter referred to as "ionic monomer") and the remaining amount of a vinyl ester in the presence of a thiolic acid wherein the total content of the ionic monomer and nonionic monomer is 0.1 to 20 mol %; said polyvinyl alcohol having a terminal mercapto group, a saponification degree of the vinyl ester unit of 50 to 70 mol %, and a hot melt flow starting temperature of 60° to 130° C.

(ii) a polymerizable monomer, and
(iii) a photopolymerization initiator.

16 Claims, No Drawings

WATER-DEVELOPABLE PHOTOSENSITIVE RESIN COMPOSITION AND RESIN OR PRINTING PLATE THEREFROM

FIELD OF THE INVENTION

The present invention relates to a water-developable photosensitive resin composition capable of hot melt molding, a resin or printing plate therefrom.

BACKGROUND OF THE INVENTION

There has been known a water-developable photosensitive resin composition for forming a relief printing plate or a resist pattern. These photosensitive resin compositions are generally composed of a water-soluble or water-dispersible polyvinyl alcohol, a polymerizable monomer and a photopolymerization initiator. The compositions, when used, are subjected to light through a negative film having an image to form a latent image by means of photopolymerization and then the unexposed part is washed with water.

For obtaining a photosensitive resin plate by using the photosensitive resin composition, the polyvinyl alcohol is primarily dissolved in water followed by the addition of the polymerizable monomer and initiator to form a mixture. The mixture is then coated on a substrate and water is evaporated to form a photosensitive resin plate. In this process, since a drying step is indispensable for the evaporation of water, it requires a large scale apparatus and consumes a lot of time and energy. Also, since most of the polymerizable monomers to be formulated into the photosensitive resin composition are relatively low molecular weight or have relatively low boiling points, environmental pollution often comes into question because of volatilization of the monomer during the drying step.

SUMMARY OF THE INVENTION

The present invention provides a photosensitive resin composition which is capable of hot melt molding and which therefore does not require a drying step. The present invention provides a water-developable photosensitive resin composition capable of hot melt molding, which comprises:

(i) a water soluble or water dispersible polyvinyl alcohol prepared by saponifying a copolymer which is obtained from copolymerizing 0 to 20 mol % of a monomer not having an ionic group (hereinafter referred to as "nonionic monomer"), 0 to 10 mol % of an ionic group-containing monomer (hereinafter referred to as "ionic monomer") and the remaining amount of a vinyl ester in the presence of a thiolic acid wherein the total content of the ionic monomer and nonionic monomer is 0.1 to 20 mol %;
said polyvinyl alcohol having a terminal mercapto group, a saponification degree of the vinyl ester unit of 50 to 70 mol %, and a hot melt flow starting temperature of 60° to 130° C.
(ii) a polymerizable monomer, and
(iii) a photopolymerization initiator.

The present invention also provides a method for preparing a water-developable photosensitive resin plate suitable for the manufacture of a relief printing plate, which comprises applying by hot melt molding the above water-developable photosensitive resin composition to a substrate.

BRIEF EXPLANATION OF PRIOR ART

Japanese Patent Publication (unexamined) No. 131609/1981 discloses a photocurable resin liquid composition comprising a polyvinyl ester containing —COO X and /or —SO$_3$X (wherein X represents hydrogen an alkali metal or NH$_4$) and/or a saponified composition thereof, an active-hydrogen containing acrylic monomer and a photopolymerization initiator. This publication clearly states that the composition is liquid. Accordingly, it is not needed to apply hot melt molding to the composition.

Japanese Patent Publication (unexamined) No. 217036/1986 discloses a water-developable photosensitive compositon comprising a vinyl alcohol polymer having a thiol group per molecule, a polymerizable ethylenically unsaturated compound and a photopolymerization initiator. There is no teaching in this document about hot melt molding.

DETAILED DESCRIPTION OF THE INVENTION

The polyvinyl alcohol (i) employed in the present invention is prepared by saponifying a copolymer which is obtained by copolymerizing an ionic monomer, a nonionic monomer and a vinyl ester in the presence of a thiolic acid. The nonionic monomer is employed in an amount of 0 to 20 mol %, preferably 5 to 15 mol %, more preferably 5 to 10 mol % based on the total amount of the monomer components of the obtained polymer. If it is more than 20 mol %, the composition is difficult to keep in a solid state. The ionic monomer is employed in an amount of 0 to 10 mol %, preferably 0 to 3 mol %, more preferably 0 to 2.5 mol % based on the total amount of the monomer components of the obtained polymer. The ionic monomer enhances water-solubility even in a small amount. Under any circumstances, a total amount of the ionic monomer and nonionic monomer should be within the range of 0.1 to 20 mol %, preferably 0.2 to 15 mol % based on the total amount of the monomer components of the obtained polymer. Amounts more than 20 mol % adversely affect the solid state of the obtained photosensitive resin composition. If the total amount is less than 0.1 mol %, the obtained resin composition is difficult to fuse.

Examples of the vinyl esters employed in the present invention are vinyl formate, vinyl acetate, vinyl propionate, vinyl benzoate and the like. Vinyl acetate is preferred.

The ionic monomer is one which has an ionic group and a vinyl group for copolymerizing with the vinyl ester. Examples of the ionic groups are a carboxyl group or a salt thereof, a sulfonic acid group or a salt thereof, a phosphoric acid group or a salt thereof, an amino group, an ammonium group and the like. Examples of the ionic monomers are (meth)acrylic acid, itaconic acid, maleic acid, maleic anhydride, fumaric acid, 2-acrylamide propanesulfonic acid, (meth)allylsulfonic acid, and a salt thereof if existent, and (meth)acrylamidepropyltrimethylammonium chloride. Preferred ionic monomers are (meth)acrylic acid, itaconic acid, maleic anhydride, 2-acrylamide-propanesulfonic acid and (meta)allylsulfonic acid.

Examples of the nonionic monomers are not specifically limited, but vinyl monomers having 2 to 12 carbon atoms are preferred. Examples of the nonionic monomers are an alpha-olefin, such as ethylene, propylene, 1-butene, isobutene and the like; an ester of (meth)acrylic acid, such as methyl (meth)acrylate, ethyl (meth)acrylate, butyl (meth)acrylate and the like; (meth)acrylamide; N,N-dimethylacrylamide; N-vinylpyrrolidone, allyl acetate; allyl alcohol; 2-methyl-3-butene-2-ol; isopropenyl acetate; and the like. Preferred are (meth)acrylate, N,N-(dimethylacrylamide, N-vinylpyrrolidone, allyl acetate, allyl alcohol, 2-methyl-3-butene-2-ol, and isopropenyl acetate.

The above mentioned monomers are copolymerized in the presence of the thiolic acid to obtain a polyvinyl ester having a terminal thioester group, which is then saponified to form a polyvinyl alcohol having a terminal mercapto group. The thiolic acid encompasses an organic thiolic acid having —COSH group. Examples of the thiolic acids are thiolacetic acid, thiolpropionic acid, thiolbutyric acid, thiolvaleric acid and the like. An amount of the thiolic acid is 0.01 to 2 mol %, preferably 0.05 to 1 mol %, more preferably 0.1 to 1 based on the total amount of the monomer components of the obtained polymer. The thiol group in the polyvinyl alcohol enhances photosensitivity of the photosensitive resin composition.

The polyvinyl alcohol of the present invention requires the following properties: (a) The obtained photosensitive resin composition has a suitable melt viscosity. (b) The polyvinyl alcohol is well compatible with the polymerizable monomer (ii). (c) The polyvinyl alcohol is water-soluble or water-dispersible. By the wording "water-soluble or water-dispersible" is meant that a vinyl alcohol polymer is completely dissolved or dispersed when it is dissolved in water to a concentration of 1 % by weight at 25° C. (d) The obtained photosensitive resin composition has good dimensional stability, that is, it has good creep resistance (against heat) for shape retention. In order to meet the required properties, it is necessary that the polyvinyl alcohol of the present invention has a saponification degree of the vinyl ester unit of 50 to 70 mol % and a hot melt flow starting temperature of 60° to 130° C. It is, also, desired that the polyvinyl alcohol has an average polymerization degree of not more than 1,000, preferably not more than 700, more preferably within the range of 100 to 500. By "hot melt flow starting temperature" herein is meant a temperature at which a polyvinyl alcohol having a water content of 3 weight % starts to flow when heated at 6° C./min under a load of 50 Kg in a flow tester equipped with a nozzle having a diameter of 1 mm and a length of 1 mm. The hot melt flow starting temperature of the present invention is preferably 70° to 120° C., more preferably 80° to 100° C. If the temperature is more than 130° C., extruding of the resin becomes too difficult due to partial polymerization of the composition by heat. If the temperature is less than 60° C., the composition is difficult to keep in a solid state. A saponification degree of the vinyl ester unit, although it varies depending on the content of the ionic and nonionic monomer, is within the range of 50 to 70 mol % because of the compatibility with the polymerizable monomer (ii). Preferably, it is within the range of 55 to 68 mol %, more preferably 60 to 67 mol %, most preferably not less than 60 to less than 65 mol %. Degrees more than 70 mol % become unsuitable due to an elevated hot melt flow starting temperature. Degrees less than 50 mol % become difficult to use because a dimensional stability of the resin plate and water solubility decline. The average polymerization degree ($\bar{p}$) is calculated according to the viscosity formula using an intrinsic viscosity ($\eta$) measured at 30° C. in water. If the polyvinyl alcohol has an average polymerization degree of more than 1,000, its melt viscosity becomes too high. If it is less than 100, it is difficult to keep the polymerizable monomer (ii) in the resin composition.

The polymerizable monomer (ii) is a compound which has a polymerizable double bond per molecule. Examples of the polymerizable monomers are methyl acrylate, ethyl acrylate, n-propyl acrylate, beta-hydroxyethyl acrylate, beta-hydroxypropyl acrylate, polyethylene glycol monoacrylate, polypropylene glycol monoacrylate, polyethylene glycol diacrylate, polypropylene glycol diacrylate, methoxypolyethylene glycol monoacrylate, ethoxypolyethylene glycol monoacrylate, glycerol diacrylate, pentaerythritol diacrylate, trimethylolpropane triacrylate, tetramethylolmethane tetraacrylate, methyl methacrylate, ethyl methacrylate, n-propyl methacrylate, beta-hydroxyethyl methacrylate, beta-hydroxypropyl methacrylate, polyethylene glycol monomethacrylate, polypropylene glycol monomethacrylate, polyethylene glycol dimethacrylate, polypropylene glycol dimethacrylate, methoxypolyethylene glycol monomethacrylate, ethoxypolyethylene glycol monomethacrylate, glycerol dimethacrylate, pentaerythritol dimethacrylate, trimethylolpropane trimethacrylate, tetramethylolmethane tetramethacrylate, acrylamide, N-(methylol)acrylamide, N-(butoxymethyl)acrylamide, (isobutoxy)acrylamide, N-(t-butyl)acrylamide, methylene-bis(acrylamide), ethylene-bis(acrylamide), propylene-bis(acrylamide), methacrylamide, N-(methylol)methacrylamide, N-(butoxymethyl)methacrylamide, N-(isobutoxymethyl)methacrylamide, N-(t-butyl)methacrylamide, methylene-bis(methacrylamide), ethylene-bis(methacrylamide), propylene-bis(methacrylamide), butylcarbamoyloxyethyl (meth)acrylate and a mixture thereof.

The polymerizable monomer (ii) may be the specific monomer having at least two free hydroxyl groups and the following formula:

$$\begin{array}{c} CH_2-X \\ | \\ CH-OH \\ | \\ CH_2-Y \end{array} \quad (I)$$

wherein X represents

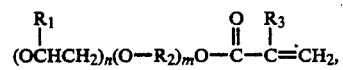

Y represents

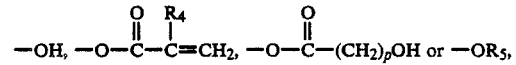

wherein $R_1$, $R_3$ and $R_4$, which are the same or different, respectively represents a hydrogen atom or a methyl group, $R_2$ represents an alkylene group having 1 to 5 carbon atoms and a hydroxyl group, $R_5$ represents an alkyl group having 1 to 5 carbon atoms and a hydroxyl group, n is an integer of 4 to 23, m is 0 or 1 and p is an integer of 1 to 5. Examples of the specific monomers (I) are

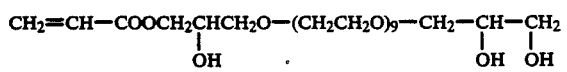

(II)

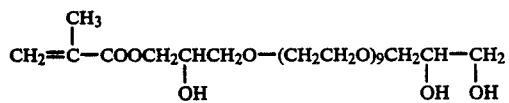

(III)

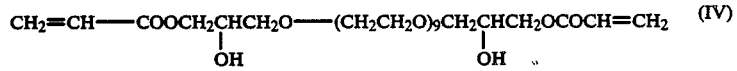

(IV)

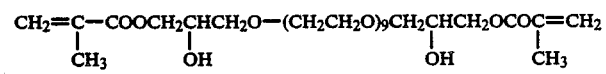

(V)

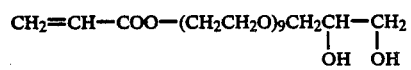

(VI)

or

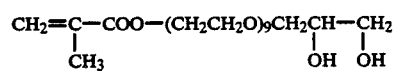

(VII)

The specific monomer (I) can also be a derivative in which a terminal hydroxyl group is esterified with acrylic acid or methacrylic acid. The specific monomer (I) may be mixed with the other nonspecific monomer listed above. The specific monomer (I) imparts a suitable hardness and rubber resilience to a cured resin composition.

The polymerizable monomer (ii) is selected in view of compatibility with the polymer employed. In order to improve the compatibility, a suitable solvent, for example, water, an alcohol having a high boiling point, such as ethylene glycol, diethylene glycol, propylene glycol, triethylene glycol, butanediol, trimethylolpropane, tetramethylolpropane, glycerol and diglycerol may be formulated.

The polymerization initiator (iii) is not specifically limited, but an aromatic ketone is generally employed. The aromatic ketone is a compound which has an aromatic ring and a carbonyl group in one molecule, and includes benzoin, benzoin methyl ether, benzoin ethyl ether, benzoin isopropyl ether, alpha-methylbenzoin, 1-methylanthraquinone, 9-fluorenone, benzyl, benzyl methyl ketal, acetophenone, 2,2'-dimethoxy-2-phenylacetophenone, benzophenone, phenyl-2-thienylketone, p-dimethylaminobenzophenone, p,p'-tetramethyldiaminobenzophenone and the like. The aromatic ketone may contain a substituent, such as cyano, nitro, methoxy, sulfonic acid, phosphine acid, a salt or an ester thereof. Representative examples of such substituted aromatic ketones are 2,6-dimethoxybenzoyl-diphenylphosphine oxide, 2,4,6-trimethylbenzoyl-diphenylphosphine oxide, an ester of 2,4,6-trimethylbenzoyl-phenylphosphinic acid, a sodium salt of 2,4,6-trimethylbenzoyl-phenylphosphinic acid and the like.

The polyvinyl alcohol (i) is generally formulated into the resin composition of the present invention in an amount of 50 to 300 parts by weight, preferably 60 to 250 parts by weight, more preferably 70 to 200 parts by weight based on 100 parts by weight of the polymerizable monomer (ii). The polymerization initiator (iii) is generally formulated into the resin composition in an amount of 0.01 to 10 parts by weight, preferably 0.02 to 5 parts by weight, more preferably 0.03 to 4 based on 100 parts by weight of the monomer (ii).

The water-developable photosensitive resin composition of the present invention may further contain an additive. The additive includes a polymerization inhibitor, such as 2,6-di-t-butyl-p-cresol, hydroquinone and p-methoxyphenol; a dye, such as Rose Bengale, eosine, methylene blue or malachite green; and the like.

Since the photosensitive resin composition of the present invention employs a particular polyvinyl alcohol (i), it is capable of hot melt molding. Hot melt molding is generally conducted by an extruder, a kneader, a hot press machine and the like. According to the present invention, the process for making a photosensitive resin plate can be shortened and can reduce its cost, since a large scale drying step is not required. In the hot melt molding process, water may be added for plasticizing the resin composition, but the amount of water to be added is very small in comparison with a conventional method mentioned above. A water content in the resin composition including water having been added is preferably not more than 10 parts by weight, more preferably within the range of 3 to 8 parts by weight based on the amount of the photosensitive resin composition of the present invention.

According to the present invention, the photosensitive resin composition is molded onto a suitable substrate to obtain a photosensitive resin plate. Examples of the substrates are metal, such as aluminum, zinc and iron; plastics, such as polyethylene terephthalate, polystyrene, polymethylmethacrylate, nylon, cellulose acetate, polyethylene, polypropylene, polycarbonate, polyacrylonitrile and polyvinylchloride; glass; a natural or synthetic rubber, a rubber foam and any combination or laminate thereof; and the like. The substrate may be preliminarily surface-treated by etching, electrolytic oxidation, corona discharge and the like. Also, the substrate may be covered with an adhesive layer, an antihalation layer and the like.

A preparation of the relief printing plate is known. For example, the photosensitive resin plate as above obtained is closely contacted with an image film, such as a negative film or a positive film, through a suitable cover layer and exposed to light. Development by washing out the photosensitive resin composition at the unexposed areas with a developer, especially water give a visible image. Exposure is conducted with actinic light sources, such as medium pressure mercury vapor lamps, high pressure mercury vapor lamps, ultra high pressure mercury vapor lamps, xenon lamps, metal halide lamps, ultraviolet, fluorescent lamps and the like. The light sources can also be tungsten lamps, white fluorescent lamps, visible light laser and the like.

The photosensitive resin composition of the present invention is water-developable and therefore is employed as various image-forming materials, such as a photoresist and the like. In case of using the monomer (I), the photosensitive resin composition has more improved water-solubility and when cured, the film has an enhanced resilience.

EXAMPLES

The present invention is illustrated by the following examples, which are not construed as limiting the invention to their details. In the Examples, "part(s)" is based on weight unless otherwise indicated.

PRODUCTION EXAMPLE 1

A reaction vessel was charged with 2,400 parts of vinyl acetate, 9 parts of methyl acrylate, 1.7 parts of sodium 2-acrylamide-2-methylpropanesulfonate, 250 parts of methanol and 0.55 parts of thiolacetic acid. The atmosphere inside the vessel was replaced with nitrogen while stirring followed by heating the outside of the vessel to 65° C. and the mixture in the vessel to 60° C. Then, 20 parts of a methanol solution containing 2 parts of 2,2'-azobisisobutylonitrile was added and then, 132 parts of methyl acrylate, 13 parts of 2-acrylamide-2-methylpropanesulfonate and 60 parts of a methanol solution containing 10.3 parts of thiolacetic acid were added over 5 hours. On the completion of the polymerization reaction, the extent of the polymerization of the production was 50.5%. The vessel was then cooled and the remaining vinyl acetate was removed together with methanol under a reduced pressure. Additional methanol was then added to obtain a 65% methanol solution containing a copolymer. It was identified by an NMR analysis that the obtained copolymer had a methyl acrylate unit of 10.2 mol %, a sodium 2-acrylamide-2-methylpropanesulfonate unit of 0.4 mol % and a vinyl acetate unit of 89.4 mol %. A saponification was conducted by adding 4.0 parts by volume of a methanol solution of 2N sodium hydroxide to 100 parts of the 65% methanol solution of the copolymer with stirring at 40° C. After 30 minutes, the obtained white gel was washed with a methyl acetate/methanol (7/3 weight ratio) solution followed by drying to form a polyvinyl alcohol (a). The polyvinyl alcohol (a) had a saponification degree of the vinyl ester unit of 64 mol % as determined by an NMR analysis. The polymerization degree was 320, which was determined by using an intrinsic viscosity measured at 30° C. in water. The polyvinyl alcohol (a) (water content: 3% by weight) had a hot melt flow starting temperature (hereinafter referred to as "flow point") of 115° C.

An amount of the mercapto group in the polyvinyl alcohol (a) which was determined by a iodine oxidation process was $0.85 \times 10^{-4}$ equivalent/g-polymer. It is believed from a polymerization mechanism that the mercapto group exists at a terminal of the molecule.

PRODUCTION EXAMPLE 2

A reaction vessel was charged with 1,200 parts of vinyl acetate, 160 parts of allyl acetate, 100 parts of methanol and 0.19 parts of thiolacetic acid. Then, 3 parts of 2,2'-azobisisobutylonitrile was added to start polymerization. Next, 30 parts of a methanol solution containing 7 parts of thiolacetic acid was added over 5 hours. On the completion of the polymerization reaction, the extent of the polymerization of the production was 45%. A 65% methanol solution containing a copolymer was obtained as generally described in Production Example 1. It was identified by an NMR analysis that the obtained copolymer had an allyl acetate unit of 10 mol %. A saponification was conducted as generally described in Production Example 1 by adding 2 parts by volume of a methanol solution of 2N sodium hydroxide to 100 parts of the 65% methanol solution of the copolymer to form a polyvinyl alcohol (b) having a terminal mercapto group. The polyvinyl alcohol (b) had a saponification degree of the vinyl ester unit of 65.8 mol %, a polymerization degree of 400, a flow point of 107° C. and an amount of the mercapto group of $0.7 \times 10^{-4}$ equivalent/g-polymer.

PRODUCTION EXAMPLE 3

A reaction vessel was charged with 2,400 parts of vinyl acetate, 250 parts of methanol, 1.0 parts of sodium 2-acrylamide-2-methylpropanesulfate and 0.56 parts of thiolacetic acid. Then, 20 parts of a methanol solution containing 1.5 parts of 2,2'-azobisisobutylonitrile was added to start polymerization at 60° C. Next, 60 parts of a methanol solution containing 10.2 parts of thiolacetic acid and 11 parts of 2-acrylamide-2-methylpropanesulfonate was added over 5 hours. On the completion of the polymerization reaction, the extent of the polymerization of the production was 44%. A 65% methanol solution containing a copolymer was obtained as generally described in Production Example 1. It was identified by an NMR analysis that the obtained copolymer had a sodium 2-acrylamide-2-methylpropanesulfonate unit of 0.35 mol %. A saponification was conducted as generally described in Production Example 1 by adding 1.1 parts by volume of a methanol solution of 2N sodium hydroxide to 100 parts of the 65% methanol solution of the copolymer to form a polyvinyl alcohol (c) having a terminal mercapto group. The polyvinyl alcohol (c) had a saponification degree of the vinyl ester unit of 61 mol %, a polymerization degree of 340, a flow point of 101° C. and an amount of the mercapto group of $0.9 \times 10^{-4}$ equivalent/g-polymer.

PRODUCTION EXAMPLE 4

A two liter flask equipped with a stirrer, a condenser and a temperature controller was charged with 370 g of xylene, 526 g of a difunctional epoxy compound having the following formula:

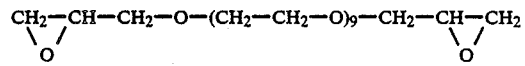

available from Kyoei-sha Yushi Kagaku Kogyo K.K. as Eporite 400E, 86 g of methacrylic acid, 18 g of water and 1 g of tetrabutylammonium chloride to obtain a mixture. The mixture was heated with stirring and maintained at reflux for 30 minutes. The mixture was then cooled to obtain a polymerizable monomer. The monomer was identified by NMR and IR as the polymerizable monomer (III) having the following formula:

$$CH_2=\underset{CH_3}{\overset{|}{C}}-COOCH_2\underset{OH}{\overset{|}{C}}HCH_2O-(CH_2CH_2O)_9CH_2\underset{OH}{\overset{|}{C}}H-\underset{OH}{\overset{|}{C}}H_2 \quad (III)$$

It had an acid value of 0.56 and a viscosity of 200 cps.

PRODUCTION EXAMPLE 5

The polymerizable monomer (II) having the following formula:

$$CH_2=CH-COOCH_2\underset{OH}{\overset{|}{C}}HCH_2O-(CH_2CH_2O)_9-CH_2-\underset{OH}{\overset{|}{C}}H-\underset{OH}{\overset{|}{C}}H_2 \quad (II)$$

was obtained as generally described in Production Example 4 with the exception that 410 g of xylene, 526 g of the difunctional epoxy compound disclosed in Production Example 4, 72 g of acrylic acid, 18 g of water and 1 g of tetrabutylammonium chloride were charged. It had an acid value of 0.59 and a viscosity of 170 cps.

PRODUCTION EXAMPLE 6

The polymerizable monomer (IV) having the following formula:

$$CH_2=CH-COOCH_2\underset{OH}{\overset{|}{C}}HCH_2O-(CH_2CH_2O)_9CH_2\underset{OH}{\overset{|}{C}}HCH_2OCOCH=CH_2 \quad (IV)$$

was obtained as generally described in Production Example 4 with the exception that 330 g of xylene, 526 g of the difunctional epoxy compound disclosed in Production Example 4, 144 g of acrylic acid and 1 g of tetrabutylammonium chloride were charged. It had an acid value of 5 and a viscosity of 15,000 cps.

PRODUCTION EXAMPLE 7

A two liter flask equipped with a stirrer, a condenser and a temperature controller was charged with 964 g of a polyethylene glycol monomethacrylate compound mainly comprising:

$$CH_2=\underset{CH_3}{\overset{|}{C}}-\underset{O}{\overset{||}{C}}-O-(CH_2-CH_2-O)_9-H$$

available from Nippon Oil and Fats Corporation as Blenmer PE-350, 148 g of glycidol available from Daisel Kagaku Kogyo K.K. and 11 g of dimethylbenzylamine to obtain a mixture. The mixture was mixed with blowing air and heated to a temperature of 120° to 140° C. at which it was maintained for one hour and then cooled to room temperature. The monomer was identified by NMR and IR as the polymerizable monomer (VII) having the following formula:

$$CH_2=\underset{CH_3}{\overset{|}{C}}-COO-(CH_2CH_2O)_9CH_2\underset{OH}{\overset{|}{C}}H-\underset{OH}{\overset{|}{C}}H_2 \quad (VII)$$

It had an acid value of 0.10 and a viscosity of 150 cps.

PRODUCTION EXAMPLE 8

The polymerizable monomer (VI) having the following formula:

$$CH_2=CH-COO-(CH_2CH_2O)_9CH_2\underset{OH}{\overset{|}{C}}H-\underset{OH}{\overset{|}{C}}H_2 \quad (VI)$$

was obtained as generally described in Production Example 7 with the exception that 936 g of the polyethylene glycol monoacrylate compound, 148 g of glycidol and 11 g of dimethylbenzylamine were charged. It had an acid value of 0.12 and a viscosity of 130 cps.

EXAMPLE 1

Part A

One hundred parts of polyvinyl alcohol (a), 15 parts of ethylene glycol and 10 parts of water was kneaded at 80° to 85° C. for 30 minutes.

Part B

Monomer mixture A

| Ingredients | Parts |
|---|---|
| Trimethylolpropane trimethacrylate | 20 |
| Epoxy ester 70PA[1] | 20 |
| N-Vinyl pyrrolidone | 20 |

[1] an epoxy ester available from Kyoei-sha Yushi Kagaku Kogyo K.K., having the formula:

$$CH_2=CH-COOCH_2\underset{OH}{\overset{|}{C}}HCH_2-O-CH_2\underset{CH_3}{\overset{|}{C}}H-O-CH_2\underset{OH}{\overset{|}{C}}HCH_2-O-COCH=CH_2$$

Into a mixture containing the above ingredients, 0.1 parts of p-methoxyphenol, 0.4 parts of 2,6-di-t-butyl-p-cresol and 3 parts of 2,2'-dimethoxy-2-phenylacetophenone were dissolved to form a solution. The solution was added to the kneaded mixture in part A and mixed at 80° C. for 30 minutes. The resultant mixture was fed into a twin screw extruder at 80° C., mixed, defoamed and extruded onto a pretreated steel panel coated with an antihalation layer having a thickness of 0.2 mm to form a composition layer of 0.5 mm in thickness. Then, a cover film was laminated on it to form a photosensitive resin plate.

The photosensitive surface of the resin plate was closely contacted under vacuum to a testing negative film having 150 line 3%, 5%, 10%, 20% half tone, isolated dots having a diameter of 100 microns and 200 microns, fine lines having a width of 40 microns and 60 microns, and exposed to a 3 KW high pressure mercury lamp at a distance of 70 cm. An irradiation time was 3 seconds for preirradiation and 15 seconds for main irradiation. The exposed resin plate was developed by blowing neutral water at a pressure of 4 Kg/cm² for one and half minutes at 40° C. using a spray developing machine. An unexposed portion, i.e. uncured portion was washed out to water to obtain a relief printing plate. The relief printing plate was dried at 100° C. for 2 minutes and there are no defects on 3% half tone, isolated dots having a diameter of 100 microns, and fine lines having 40 microns in width.

% and a polymerization degree of 320, which are outside of the present invention, were employed and tested in the conditions as shown in Table 1. Their results are shown in Table 1.

TABLE 1

| Examples number | Ingredients | | Treating conditions | | | Minimum highlight dot % | Resolving power | |
|---|---|---|---|---|---|---|---|---|
| | Polyvinyl alcohol | Monomer mixture | Pre-exposure (second) | Main-exposure (second) | Wash out time (sec) | | Isolated dots (micron) | Fine lines (micron) |
| 1 | a | A | 3 | 15 | 90 | 3 | 100 | 40 |
| 2 | a | B | 2 | 17 | 90 | 3 | 100 | 40 |
| 3 | b | A | 2 | 15 | 90 | 3 | 100 | 40 |
| 4 | b | B | 3 | 15 | 90 | 3 | 100 | 40 |
| 5 | c | A | 2 | 15 | 90 | 3 | 100 | 40 |
| Comparative Example | | | | | | | | |
| 1 | k | A | 3 | 15 | 5 min | X | X | X |
| 2 | l | A | 3 | 15 | 4.5 min | X | X | X |
| 3 | m | A | 3 | 15 | 90 | 10 | 200 | 150 |

X shows that no images remain

EXAMPLES 2 to 5 AND COMPARATIVE EXAMPLES 1 TO 3

A photosensitive resin plate was obtained from a combination of a polyvinyl alcohol shown in Table 1 and the following polymerizable monomer as generally described in Example 1 and the same tests in Example 1 were conducted. The treating conditions and their results were shown in Table 1.

| Monomer mixture B Ingredients | Parts |
|---|---|
| N-Butoxymethylacrylamide | 40 |
| Kayarad R604[2] | 20 |

[2]Available from Nihon Kayaku K.K. having the formula:

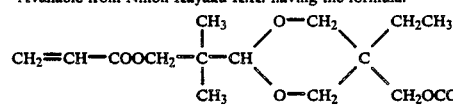

For a comparison, an unmodified polyvinyl alcohol (k) having a saponification degree of 60% and a polymerization degree of 300, an unmodified polyvinyl alcohol (l) having a saponification degree of 70% and a polymerization degree of 300, and a polyvinyl alcohol (m) removing a thiol group from that of Production Example 1 and having a saponification degree of 64 mol

EXAMPLES 6 TO 12

A photosensitive resin plate and a relief printing plate thereof were obtained from a combination of a polyvinyl alcohol and a polymerizable monomer shown in Table 2 as generally described in Example 1 and the same tests in Example 1 were conducted. The treating conditions and their results were shown in Table 2.

Using the obtained relief printing plate, printing was carried out by a Vander-cook proofing printing machine UNIVERSAL-III, Vander-cook DIVISION, ILLINOIS TOOL WORKS INC. An optical density of the solid portion is shown in Table 2, which was determined by a Macbeth reflective densitometer.

For producing a relief printing plate, the extruded material was shaped to a photosensitive resin plate having 2 mm thickness by a hot press machine using a 2 mm of spacer. The plate was exposed to a 3 Kw high pressure mercury lamp for 5 minutes. The plate was cut to a 2 cm×2 cm plate and piled to a 12 mm thickness, of which hardness (20° C.) and impact resilience of 20° C. according to JIS-K6301 were measured.

TABLE 2

| Examples number | Ingredients | | Treating conditions | | | Resolving power | | | Printing | | Physical property | | The other Compatibility with PVA |
|---|---|---|---|---|---|---|---|---|---|---|---|---|---|
| | Polyvinyl alcohol (PVA) | Monomer | Pre-exposure (second) | Main-exposure (second) | Wash out time (sec) | Minimum highlight dot % | Isolated dots (micron) | Fine lines (micron) | Optical density | Smoothness of solid portion | Hardness | Resilience % | |
| 6 | a | III | 3 | 15 | 80 | 3 | 100 | 40 | 1.2 | Good | 53° | 28 | Good |
| 7 | b | III | 4 | 15 | 80 | 3 | 100 | 40 | 1.2 | Good | 53° | 30 | Good |
| 8 | b | II | 3 | 15 | 80 | 3 | 100 | 40 | 1.2 | Good | 54° | 29 | Good |
| 9 | c | II | 4 | 15 | 80 | 3 | 100 | 40 | 1.2 | Good | 55° | 29 | Good |
| 10 | c | IV | 3 | 15 | 80 | 3 | 100 | 40 | 1.2 | Good | 55° | 30 | Good |
| 11 | a | VI | 3 | 15 | 80 | 3 | 100 | 40 | 1.2 | Good | 56° | 30 | Good |
| 12 | a | VII | 3 | 15 | 80 | 3 | 100 | 40 | 1.2 | Good | 56° | 32 | Good |

What is claimed is:

1. A water-developable photosensitive resin composition capable of hot melt molding, which comprises:
    (i) a water soluble or water dispersible polyvinyl alcohol. prepared by saponifying a copolymer which is obtained from copolymerizing 0 to 20 mol % of a monomer not having an ionic group (hereinafter referred to an "nonionic monomer"), 0 to 10 mol % of an ionic group-containing monomer (hereinafter referred to as "ionic monomer") and the remaining amount of a vinyl ester in the presence of a thiolic acid wherein the total content of the ionic monomer and nonionic monomer is 0.1 to 20 mol %;

said polyvinyl alcohol having a terminal mercapto group, a saponification degree of the vinyl ester unit of 50 to 70 mol %, and a hot melt flow starting temperature of 60° to 130° C.

(ii) a polymerizable monomer, wherein the polymerizable monomer has at least two free hydroxyl groups and the following formula:

$$\begin{array}{c} CH_2-X \\ | \\ CH-OH \\ | \\ CH_2-Y \end{array}$$

wherein X represents $$\begin{array}{c} R_1 \quad\quad\quad\quad O \quad R_3 \\ | \quad\quad\quad\quad\quad \| \quad | \\ (OCHCH_2)_n(O-R_2)_mO-C-C=CH_2, \end{array}$$

Y represents $$-OH, \; -O-\overset{O}{\overset{\|}{C}}-\overset{R_4}{\overset{|}{C}}=CH_2, \; -O-\overset{O}{\overset{\|}{C}}-(CH_2)_pOH \text{ or } -OR_5,$$

wherein $R_1$, $R_3$ and $R_4$, which are the same or different, respectively represents a hydrogen atom or a methyl group, $R_2$ represents an alkylene group having 1 to 5 carbon atoms and a hydroxyl group, $R_5$ represents an alkyl group having 1 to 5 carbon atoms and a hydroxyl group, n is an integer of 4 to 23, m is 0 or 1 and p is an integer of 1 to 5, and (iii) a photopolymerization initiator.

2. The resin composition according to claim 1 wherein the thiolic acid is thiolacetic acid.

3. The resin composition according to claim 1 wherein the vinyl ester is vinyl acetate.

4. The resin composition according to claim 1 wherein the ionic monomer is selected from the group consisting of sodium 2-acrylamide-2-methylpropanesulfate, sodium (meth)allylsulfonate and sodium vinylsulfonate.

5. The resin composition according to claim 1 wherein the nonionic monomer is a $C_1$-$C_{10}$ alkyl acrylate.

6. The resin composition according to claim 1 wherein the polyvinyl alcohol has a saponification degree of 55 to 68 mol %.

7. The resin composition according to claim 6 wherein the polymerizable monomer is $$\begin{array}{c} CH_2=CH-COOCH_2CHCH_2O-(CH_2CH_2O)_9-CH_2-CH-CH_2 \\ | \quad\quad\quad\quad\quad\quad\quad\quad\quad\quad\quad\quad\quad\quad\quad\quad | \quad\quad | \\ OH \quad\quad\quad\quad\quad\quad\quad\quad\quad\quad\quad\quad\quad\quad\quad\quad\; OH \quad OH \end{array}$$

-continued $$\begin{array}{c} CH_3 \\ | \\ CH_2=C-COOCH_2CHCH_2O-(CH_2CH_2O)_9CH_2CH-CH_2 \\ \quad\quad\quad\quad\quad\quad | \quad\quad\quad\quad\quad\quad\quad\quad\quad\quad\quad\quad\quad | \quad\quad | \\ \quad\quad\quad\quad\quad\quad OH \quad\quad\quad\quad\quad\quad\quad\quad\quad\quad\quad\quad\quad OH \; OH \end{array}$$

$$\begin{array}{c} CH_2=CH-COOCH_2CHCH_2O- \\ | \\ OH \end{array}$$

$$\begin{array}{c} -(CH_2CH_2O)_9CH_2CHCH_2OCOCH=CH_2 \\ | \\ OH \end{array}$$

$$\begin{array}{c} CH_2=C-COOCH_2CHCH_2O- \\ | \quad\quad\quad\quad\quad\quad\quad\quad | \\ CH_3 \quad\quad\quad\quad\quad\quad OH \end{array}$$

$$\begin{array}{c} -(CH_2CH_2O)_9CH_2CHCH_2OCOC=CH_2 \\ | \quad\quad\quad\quad | \\ OH \quad\quad CH_3 \end{array}$$

$$\begin{array}{c} CH_2=CH-COO-(CH_2CH_2O)_9CH_2CH-CH_2 \\ \quad\quad\quad\quad\quad\quad\quad\quad\quad\quad\quad\quad\quad\quad\quad\quad | \quad\quad | \\ \quad\quad\quad\quad\quad\quad\quad\quad\quad\quad\quad\quad\quad\quad\quad\quad OH \; OH \end{array}$$

or $$\begin{array}{c} CH_2=C-COO-(CH_2CH_2O)_9CH_2CH-CH_2. \\ | \quad\quad\quad\quad\quad\quad\quad\quad\quad\quad\quad\quad\quad\quad\quad\quad\quad | \quad\quad | \\ CH_3 \quad\quad\quad\quad\quad\quad\quad\quad\quad\quad\quad\quad\quad\quad\quad OH \; OH \end{array}$$

8. The resin composition according to claim 1 wherein the photopolymerization initiator is an aromatic ketone.

9. The resin composition according to claim 1 comprising 50 to 300 parts by weight of the component (i), and 0.01 to 10 parts by weight of the component (iii) based on 100 parts by weight of the component (ii).

10. The resin composition according to claim 1 having a water content of not more than 10% by weight.

11. A water-developable photosensitive resin plate which comprises a substrate and a water-developable photosensitive resin composition formed thereon, said water-developable photosensitive resin composition being that according to any one of claims 1–6, 7–10.

12. A relief printing plate which is prepared by the use of the photosensitive resin plate according to claim 10.

13. A method for preparing a water-developable photosensitive resin plate suitable for the manufacture of a relief printing plate, which comprises applying by hot melt molding a water-developable photosensitive resin composition to a substrate in which said water-developable photosensitive resin composition is that according to any one of claims 1–6, 7–10.

14. The method according to claim 13 wherein said water-developable photosensitive resin composition has a water content of not more than 10% by weight.

15. A method for preparing a relief printing plate comprising subjecting the photosensitive resin plate according to claim 11 to light through a negative film having an image and then washing the photosensitive composition at the unexposed part with water.

16. A method for preparing a relief printing plate comprising subjecting the photosensitive resin plate prepared according to claim 13 to light through a negative film having an image and then washing the photosensitive composition at the unexposed part with water.

* * * * *